United States Patent [19]
Orlowski et al.

[11] Patent Number: 5,741,736
[45] Date of Patent: Apr. 21, 1998

[54] PROCESS FOR FORMING A TRANSISTOR WITH A NONUNIFORMLY DOPED CHANNEL

[75] Inventors: Marius K. Orlowski; Frank Kelsey Baker, Jr., both of Austin, Tex.

[73] Assignee: Motorola Inc., Schaumburg, Ill.

[21] Appl. No.: 645,939

[22] Filed: May 13, 1996

Related U.S. Application Data

[63] Continuation of Ser. No. 434,210, May 4, 1995, abandoned.

[51] Int. Cl.$^6$ ............................................. H01L 21/336
[52] U.S. Cl. ........................... 438/286; 438/304; 438/305; 438/531; 438/596; 438/944
[58] Field of Search ............................. 437/40, 41, 44, 437/35, 36, 27, 29, 30

[56] References Cited

U.S. PATENT DOCUMENTS

| | | | |
|---|---|---|---|
| H986 | 11/1991 | Codella et al. | 437/41 AS |
| 4,198,250 | 4/1980 | Jecmen . | |
| 4,404,576 | 9/1983 | Ronen . | |
| 4,442,589 | 4/1984 | Doo et al. | 437/44 |
| 4,558,338 | 12/1985 | Sakata | 437/36 |
| 4,679,311 | 7/1987 | Lakhani et al. | 29/579 |
| 4,682,404 | 7/1987 | Miller et al. . | |
| 4,727,038 | 2/1988 | Watabe et al. | 437/29 |
| 4,801,555 | 1/1989 | Holly et al. | 437/44 |
| 4,933,994 | 6/1990 | Orban | 437/44 |
| 5,024,959 | 6/1991 | Pfeister | 437/34 |
| 5,053,849 | 10/1991 | Izawa et al. | 357/59 |
| 5,151,374 | 9/1992 | Wu | 437/29 |
| 5,155,563 | 10/1992 | Davies et al. . | |
| 5,202,276 | 4/1993 | Mamli | 437/41 DM |

(List continued on next page.)

FOREIGN PATENT DOCUMENTS

| | | | |
|---|---|---|---|
| 53-112069 | 9/1978 | Japan | 437/36 |
| 58-93279 | 6/1983 | Japan | 437/44 |
| 59-74674 | 4/1984 | Japan | 437/44 |
| 62-23156 | 1/1987 | Japan | 437/41 AS |
| 62-29165 | 2/1987 | Japan | 437/40 DM |
| 62-285468 | 12/1987 | Japan | 437/44 |
| 2-98142 | 4/1990 | Japan | 437/40 GS |
| 4-180633 | 6/1992 | Japan | 437/35 |
| 5-109761 | 4/1993 | Japan | 437/40 AS |

OTHER PUBLICATIONS

T.N. Buti, et al., IEEE Trans. Electron Dev., 38, 8 (1991) 1757, "A New Asymmetrical halo Source Gold Drain . . . MOSFET . . ." Aug. 1991.

S.N. Chakravarti, et al., IBM Tech. Discl. Bulletin, 19, 4 (1976) 1162, "DMOSFET" Sep. 1976.

Translations of JP 53–112069, 62–29166, 4–180633 Sep 1978.

S. Wolf, "Silicon Processing For the VLSI Era" vol II, 1992, pp. 144–147, 356–363.

Wolf; "Silicon Processing For the VLSI Era, vol. 2–Process Integration;" Lattice Press; pp. 348–55; (1990).

Luscher, et al; "SACMOS, A New Procedure for High Density Integrated Circuits"; Revue Polytechnique No. 5; pp. 455–57 (1985).

Luscher et al; "A High Density CMOS Process"; ISSCC pp. 260–261 & 361 (1985).

*Primary Examiner*—Charles L. Bowers, Jr.
*Assistant Examiner*—Leon Radomsky
*Attorney, Agent, or Firm*—George R. Meyer

[57] ABSTRACT

A semiconductor device (83)including a transistor (85) with a nonuniformly doped channel region can be formed with a relatively simple process without having to use high dose implants or additional heat cycles. In one embodiment, a polysilicon layer (14) and silicon nitride layer (16) are patterned at the minimum resolution limit. The polysilicon layer is then isotropically etched to form a winged gate structure (32). A selective channel implant step is performed where ions are implanted through at least one of the nitride wings of the winged gate structure (32) but are not implanted through the polysilicon layer (14). Another polysilicon layer (64)is conformally deposited and etched such that the polysilicon (74) does not extend beyond the edges of the nitride wings.

27 Claims, 5 Drawing Sheets

U.S. PATENT DOCUMENTS

| | | | |
|---|---|---|---|
| 5,213,989 | 5/1993 | Fitch et al. | 437/31 |
| 5,227,321 | 7/1993 | Lee et al. | |
| 5,272,100 | 12/1993 | Satoh et al. | 437/29 |
| 5,316,961 | 5/1994 | Okazawa | 437/35 |
| 5,364,807 | 11/1994 | Hwang | 437/44 |
| 5,371,394 | 12/1994 | Ma et al. | 437/44 |
| 5,372,960 | 12/1994 | Davies et al. | 437/14 |
| 5,427,964 | 6/1995 | Kaneshiro et al. | 437/57 |
| 5,441,906 | 8/1995 | Burger | 437/57 |
| 5,451,807 | 9/1995 | Fujita | 257/404 |
| 5,482,878 | 1/1996 | Burger et al. | 437/41 AS |
| 5,484,743 | 1/1996 | Ko et al. | 437/44 |
| 5,510,279 | 4/1996 | Chien et al. | 437/41 |
| 5,604,138 | 2/1997 | Lee et al. | 437/41 |
| 5,604,139 | 2/1997 | Codama et al. | 437/36 |

PROCESS FOR FORMING A TRANSISTOR WITH A NONUNIFORMLY DOPED CHANNEL

This application is a continuation of prior patent application Ser. No. 08/434,210 filed May 4, 1995, abandoned.

FIELD OF THE INVENTION

The present invention relates to semiconductor devices, and in particular, to semiconductor devices having field-effect transistors with nonuniformly doped channel regions.

BACKGROUND OF THE INVENTION

Semiconductor devices continue to have their dimensions reduced as technological innovations progress. Currently, many devices are being formed with channel lengths of about 0.65 microns or less. Problems arise when the channel length gets below 0.65 microns. In older technologies, a threshold voltage adjust doping step is used to control the threshold voltage of the device. In many instances, this threshold voltage adjust doping step affects a transistor's entire channel region area near the gate electrode. The doping concentration of the threshold voltage adjust doping step has increased as devices have become smaller. This doping concentration becomes relatively high and degrades the performance of small-dimensional devices because carrier mobility significantly decreases.

Transistors having nonuniformly doped channel regions are being investigated to overcome the carrier mobility problems. As used in this specification, a nonuniformly doped channel region means that the doping concentration within the channel region near the gate dielectric layer varies between the source and drain regions of the transistor. The doping concentration may be highest near the source region, drain region, or at a point between the source and drain regions.

Processes used to form these transistors may be highly complex. In one complex process, a gate electrode is formed from multiple silicon segments that are strapped together. A gate oxide under the gate electrode can have a variable thickness. The gate oxide is typically thicker near the drain region and thinner near the source region. This process has extra oxidation, masking, and etching steps. The additional steps typically result in lower yield as handling increases. Also, the process usually requires at least one step that has little margin for mistake. Further, the width of the gate electrode is typically wider than the minimum lithography limit and results in a relatively large device.

Therefore, a need exists for a process for forming transistors having nonuniformly doped channel regions without having any of the problems related to process complexity.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

A semiconductor device including a transistor with a nonuniformly doped channel region can be formed with a relatively simple process without having to use relatively high dose implants or additional heat cycles. In one embodiment, a polysilicon layer and a silicon nitride layer are patterned at the minimum resolution limit. The polysilicon layer is then isotropically etched to form a winged gate structure. A selective channel implant step is performed where ions are implanted through at least one of the nitride wings of the winged gate structure but are not implanted through the polysilicon. Another polysilicon layer is conformally deposited and etched such that the polysilicon does not extend beyond the edges of the nitride wings. The silicon nitride is a hard mask when etching the conformally deposited polysilicon layer. The present invention is better understood with the embodiments described below.

Device with a Transistor having a Nonuniformly Doped Channel Region

Figure 1:
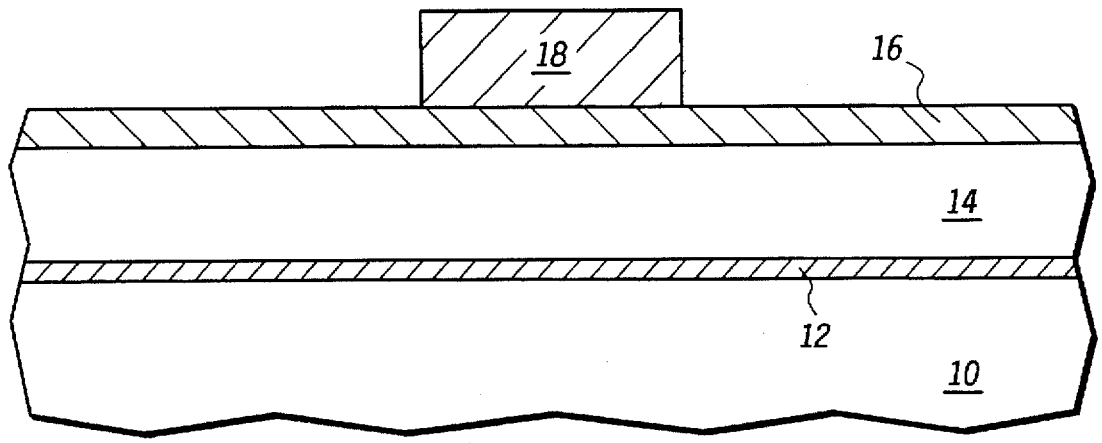
FIG. 1 includes an illustration of a cross-sectional view of a semiconductor substrate after forming three layers and a resist member.

FIG. 1 includes an illustration of a cross-sectional view of a semiconductor substrate 10. A gate dielectric layer 12, a polycrystalline silicon (polysilicon) layer 14, and a silicon nitride layer 16 are formed over the substrate. The gate dielectric layer 12 typically has a thickness less than 200 angstroms and usually in range of 50–100 angstroms. The gate dielectric layer 12 includes a nitride, an oxide, a nitrided oxide, or the like. The gate dielectric layer 12 is formed by thermally growing the layer from substrate 10, depositing a layer over substrate 10, or a combination of thermal growth and deposition. The polysilicon layer 14 typically has a thickness and a range of 500–3000 angstroms thick and is in-situ doped, furnace doped, or ion implanted. The silicon nitride layer 16 is deposited over the polysilicon layer 14 to a thickness less than 500 angstroms. The thickness of the silicon nitride layer 16 is selected such that it is an anti-reflective layer and an etch-stop layer during a subsequent processing step. The silicon nitride layer is typically in a range of 100–300 angstroms thick. A resist layer is coated over the silicon nitride layer 16 and patterned to form a resist member 18 as shown in FIG. 1.

Figure 2:
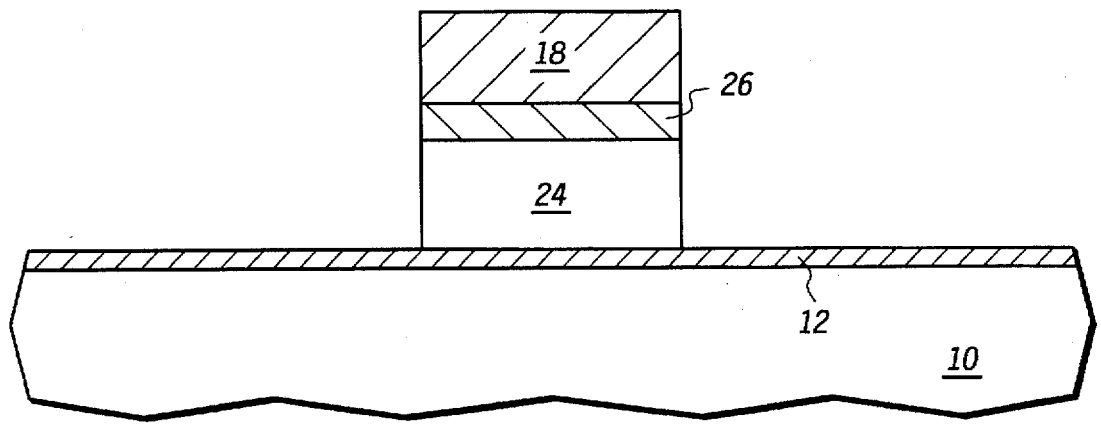
FIG. 2 includes an illustration of a cross-sectional view of the substrate of FIG. 1 after an anisotropic etching step.

An etching step is performed to pattern the silicon nitride and polysilicon layers to form a polysilicon member 24 and a silicon nitride member 26 as shown in FIG. 2. The etching step is performed anisotropically such that the sides of the resist member 18, silicon nitride member 26, and polysilicon member 24 are generally coincident with one another. The etch stops on the gate dielectric layer 12.

Figure 3:
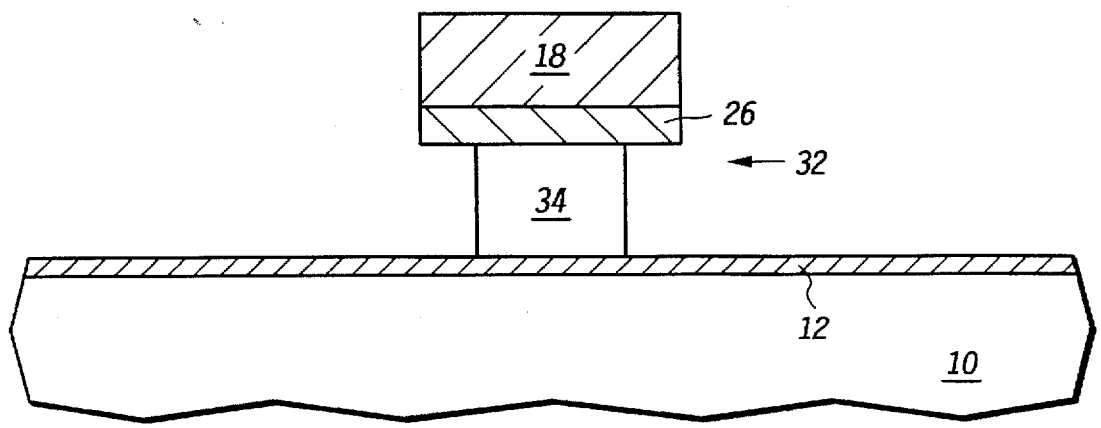
FIG. 3 includes an illustration of a cross-sectional view of the substrate of FIG. 2 after undercutting a portion of a resist member during an isotropic etching step in accordance with the present invention.

A second etching step is performed while the resist member 18 and silicon nitride member 26 are over the polysilicon member 24. This second etching step is isotropic and undercuts the silicon nitride member 26 and resist member 18. This results in a reduced-width polysilicon member 34 as shown in FIG. 3. The etching step is performed such that the width of the polysilicon member 34 is in a range of 50–90 percent of the width of the overlying silicon nitride member 26. As one example of dimensions, the resist and silicon nitride member are formed at a minimum resolution of 0.50 microns and the width of the polysilicon member 34 is about 0.30 microns. The silicon nitride member 26 is undercut by about 0.10 microns on each side. The combination of the polysilicon and silicon nitride members is a winged-gate structure 32. Portions of the silicon nitride member 26 that do not overlie the polysilicon member 34 are nitride wings.

Figure 4:
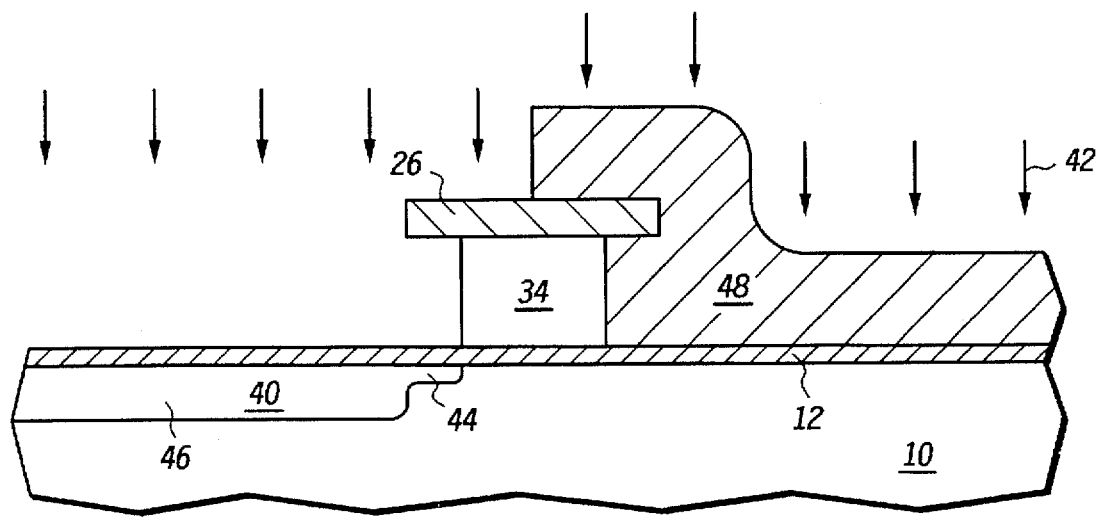
FIG. 4 includes an illustration of a cross-sectional view of the substrate of FIG. 3 during an ion implanting step in accordance with the present invention.

The resist member 18 is removed and a different resist member 48 is formed as shown in FIG. 4. The resist member 48 covers a portion of the polysilicon member 34, but does not extend over the left side of the silicon nitride member 26 that does not overlie the polysilicon member 34. The substrate is ion implanted with a p-type dopant illustrated by the arrows 42 as shown in FIG. 4. The step selectively dopes the substrate. The resist member 48 does not allow the ions to penetrate into the substrate 10 to the right of polysilicon member 34. However, the ions do enter the substrate 10 to the left of polysilicon member 34.

This step forms a doped region 40 that includes a body section 46 and a tip section 44. Body section 46 is deeper, and tip section 44 is shallower. During this step the energy of the ion implant is targeted such that the projected range of the implant within tip section 44 lies just below the gate dielectric layer 12. The doping concentration is typically in a range of 1E11 to 1E13 ions per square centimeter using singly charged boron ions each having a mass of about 11 atomic mass units ($B+_{11}$). For $B+_{11}$, the energy used for this implant is typically in a range of 10 to 30 KeV if the silicon nitride member 26 is 200 angstroms thick and the gate dielectric layer 12 is 100 angstroms thick.

Figure 5:
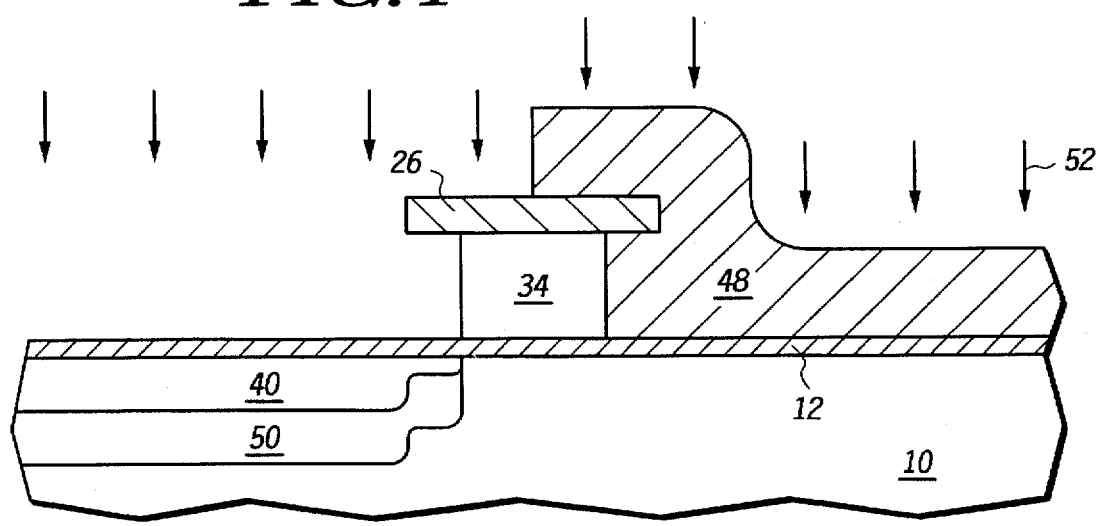
FIG. 5 includes an illustration of a cross-sectional view of the substrate of FIG. 4 after forming a punchthrough voltage adjusting doping step in accordance with the present invention.

Another ion implant step is performed and is illustrated by arrows 52 as shown in FIG. 5. This step forms a doped region 50 that increases the punchthrough voltage between the source and drain regions of a transistor. This is a deeper implant compared to the previous implant and typically does not affect the doping concentration immediately adjacent to the substrate-gate dielectric interface. Therefore, the threshold voltage of the transistor is more dependent on the doping concentration of tip section 44 as opposed to doped region 50.

Figure 6:
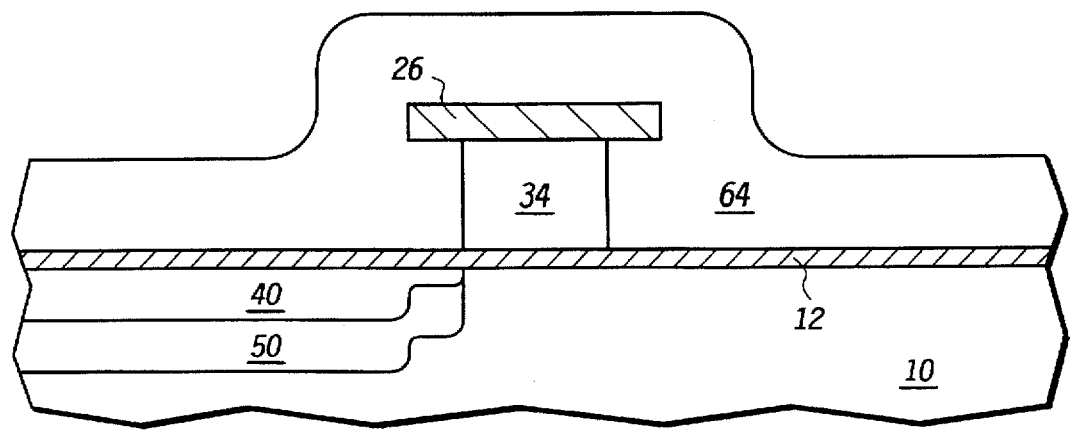
FIG. 6 includes an illustration of a cross-sectional view of the substrate of FIG. 5 after forming a layer over a winged gate structure in accordance with the present invention.

The resist member 48 is removed and a polysilicon layer 64 is formed over the substrate 10, the silicon nitride member 26, and underneath portions of the silicon nitride member 26 adjacent to the polysilicon member 34 as shown in FIG. 6. This layer must have a thickness such that it completely fills the area between the silicon nitride member 26 and substrate 10. The thickness of this layer is typically at least one-half the thickness of the polysilicon layer 14 that forms the polysilicon member 34. For example, if polysilicon layer 14 is 2000 angstroms thick, the polysilicon layer 64 is at least 1000 angstroms thick. In the particular embodiment, the thickness of the polysilicon layer 64 is 1500 angstroms thick to allow for variation in the thickness of the polysilicon layer 14.

Figure 7:
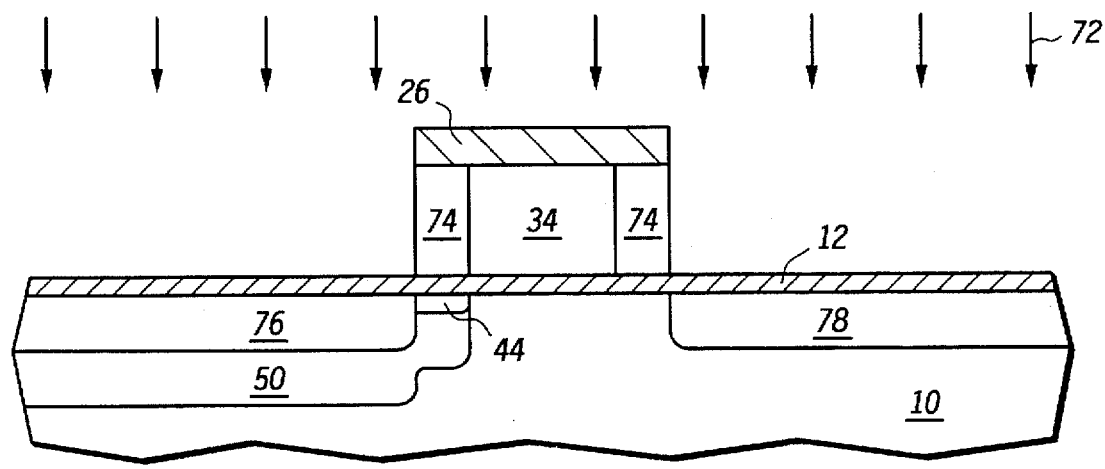
FIG. 7 includes an illustration of a cross-sectional view of the substrate of FIG. 6 during an ion implanting step in accordance with the present invention.

An etching sequence is performed to remove portions of the polysilicon layer 64 that do not underlie the silicon nitride member 26 leaving remaining polysilicon portions 74 as seen in FIG. 7. In one embodiment, an isotropic etching step is performed until an endpoint is detected and is followed by a timed anisotropic etching step. In other embodiments, a solely isotropic or anisotropic etch can be used. However, if the remaining portions 74 are not to extend beyond the edges of the silicon nitride member 26, a solely isotropic etch may remove too much of the remaining polysilicon portions 74 near the silicon nitride member 26, and if a solely anisotropic etch is used, the overetch may etch too much of the gate dielectric layer 12 and cause substrate pits to form within the substrate 10. In one embodiment, a solely anisotropic etch can be performed, but the remaining polysilicon portions 74 near the gate dielectric layer 12 would extend beyond the edges of the silicon nitride member 26.

Figure 8:
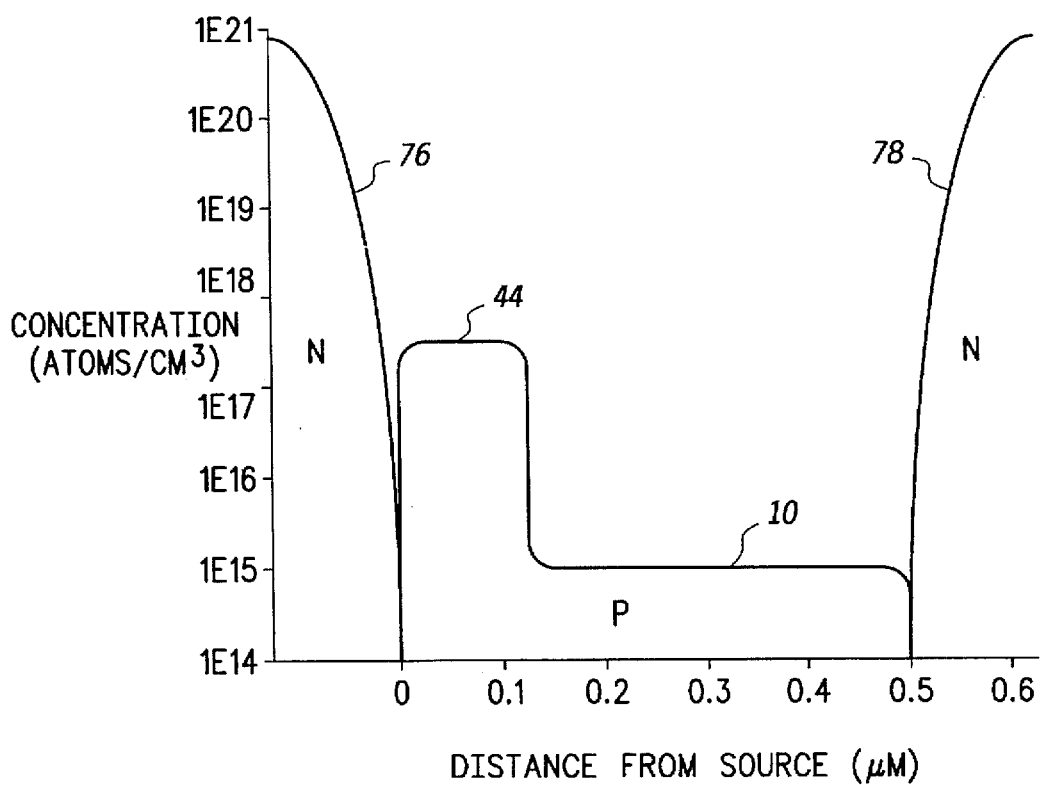
FIG. 8 includes a plot of dopant concentration versus distance from the source region.

The substrate 10 is ion implanted with singly charged arsenic ions each having a mass of about 75 atomic mass units (As+75) and is illustrated by arrows 72 in FIG. 7. The step forms a source region 76 and a drain region 78. Note that the tip section 44 and the doped region 50 lie adjacent to the source region 76 but not the drain region 78. FIG. 8 includes a plot of doping concentration across the substrate surface between the source region 76 and the drain region 78. As shown in FIG. 8, the peak doping concentration of source region 76 and drain region 78 is between 1E20 and 1E21 atoms per cubic centimeter. Tip section 44 has a peak concentration between 1E17 and 1E18 atoms per cubic centimeter. Tip section 44 is about 0.1 microns wide. A portion of the substrate 10 lies between the tip section 44 and the drain region 78, is about 0.4 microns wide, and has a doping concentration of about 1E15 atoms per cubic centimeter. The source and drain regions 76 and 78 are n-type doped, and the tip section 44 and substrate 10 are p-type doped. The physical channel length of the transistor is the distance between the source and drain regions 76 and 78 and is about 0.5 microns.

During the operation of the transistor shown in FIG. 7, the substrate 10 is strongly inverted by the time tip section 44 just becomes inverted because the doping concentration within substrate 10 is lower than tip section 44. Most of the potential drop across the channel region occurs within the tip section 44. Therefore, the electrically measured channel length of the transistor is less than the physical channel length of about 0.5 microns.

Figure 9:
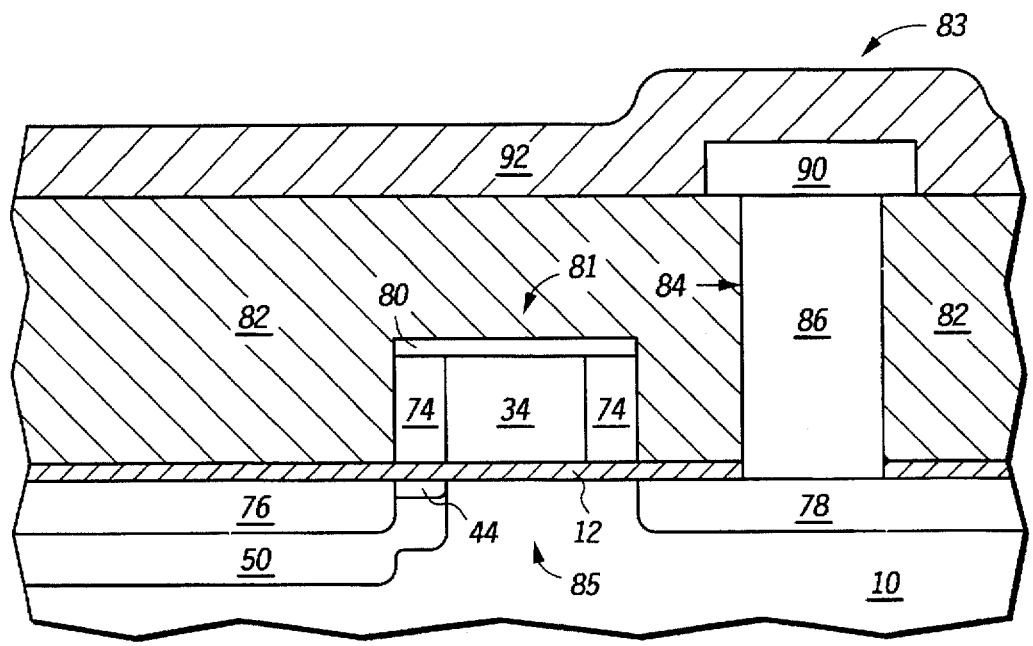
FIG. 9 includes an illustration of a cross-sectional view of the substrate of FIG. 7 after forming a substantially completed device.

Processing continues to form a substantially completed device 83 as shown in FIG. 9. The silicon nitride member 26 is removed and replaced with a titanium silicide member 80 that overlies the polysilicon member 34 and portions 74. The silicide member 80 is conductive and is used to improve the electrical connection between the polysilicon member 34 and portions 74 to form a single gate electrode 81 for the transistor 85. An interlevel dielectric layer 82 is formed over the substrate and is patterned to form a contact opening 84. The contact opening 84 is filled with a conductive material to form a contact plug 86 that is electrically connected to drain region 78. An interconnect 90 is formed that overlies the contact plug 86, and a passivation layer 92 is formed over the interconnect 90. Other electrical connections are made to the source region 76 and gate electrode 81 but are not shown in FIG. 9. In other embodiments, additional insulating layers and interconnect levels can be formed, if needed.

Alternate Embodiments

A variety of materials may be used in forming the semiconductor device previously described. Referring to FIG. 1, layer 14 needs to etch at a different rate compared to layers 12 and 16. However, layers 12 and 16 can be the same or different materials. Besides polysilicon, layer 14 can include a metal-containing material, amorphous silicon, germanium, silicon-germanium, silicon-carbide, or the like. Metal-containing materials include silicides, tungsten, or other refractory metals.

Layer 16 can include not only silicon nitride, but other insulating materials such as oxide or a combination of oxide and nitride. Layer 16 could also include silicon or a metal-containing material. Layer 16 can include a plurality of different layers. In one specific embodiment, layer 16 includes a layer of silicon-rich silicon nitride having a refractive index of about 2.9 and a thickness in a range of 160–200 angstroms thick covered by a silicon nitride layer having a thickness of at least 100 angstroms thick. In this particular embodiment, the silicon-rich silicon nitride layer is an anti-reflective layer, and the silicon nitride layer is an insulator.

Several different types of sequences can be used to form the doped regions within the substrate 10. For example, doped region 50 may be formed on both sides of the gate electrode 81 to further increase the punchthrough voltage between the source and drain regions 76 and 78. In this embodiment, the resist member 48 would not be present during the implant used to form the doped region 50 as shown in FIG. 5.

Further, the source and drain regions 76 and 78 can be formed at a number of different times. For example, the source and drain regions 76 and 78 are formed after forming the polysilicon member 24 as shown in FIG. 2. In this particular embodiment, the dopant would be implanted into the substrate before forming the polysilicon layer 64 and then the doped regions 40 and 50 would be formed after the polysilicon member 34 is formed. In another embodiment, lightly doped drains could also be formed. Several other different sequences are possible and the ones that have been presented are merely to illustrate and not limit the invention.

In still other embodiments, different doping species can be used to form the doped region 40. For example, boron difluoride ($BF_2$) can be used. If $BF_2$ is used, the energy is increased such that it is in a range of about 30–100 KeV to allow penetration of the $BF_2$ through both the silicon nitride member 26 and the gate dielectric layer 12. The energy needed can be further increased or decreased if the thickness of the silicon nitride member 26 and gate dielectric layer 12 changes.

Figure 10:
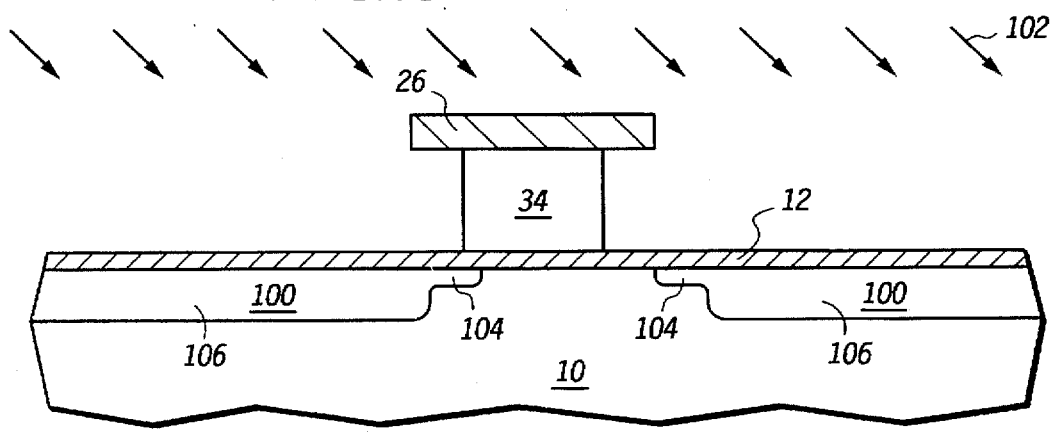
FIG. 10–12 include illustrations of another embodiment of the present invention.

Other types of implanting techniques can be used. After forming the polysilicon member 34 as shown in FIG. 3, the resist member 18 is removed. A tilt angle implant is performed as illustrated by arrows 102 in FIG. 10. As used in this specification, a tilt angle implant is an ion implant that is performed such that the ion beam is at least 10 degrees from a direction perpendicular to the primary surface of the substrate (i.e., at least 10 degrees from vertical). The tilt angle implant step forms doped regions 100, which each include a body section 106 and a tip section 104. The angle selected for the implant in 102 should be designed such that the left tip section 104 underlies part of the polysilicon member 34, but the right tip section 104 does not underlie the polysilicon member 34 or the silicon nitride member 26. The tilt angle implant is typically performed at an angle in a range of 20–60 degrees from vertical.

Figure 11:
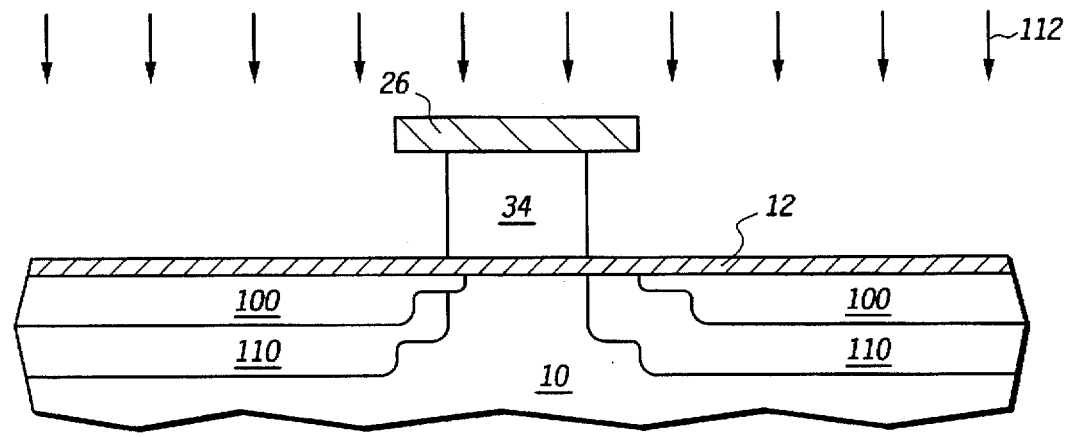

Another implant is performed as illustrated by arrows 112 to form doped regions 110 as shown in FIG. 11. Doped regions 110 are similar to doped region 50 and are used to increase the punchthrough voltage of the transistor being formed. Unlike doped region 100, doped regions 110 are not formed using a tilt angle implant. Still, in another embodiment, doped regions 110 could be formed similar to doped regions 100.

Figure 12:
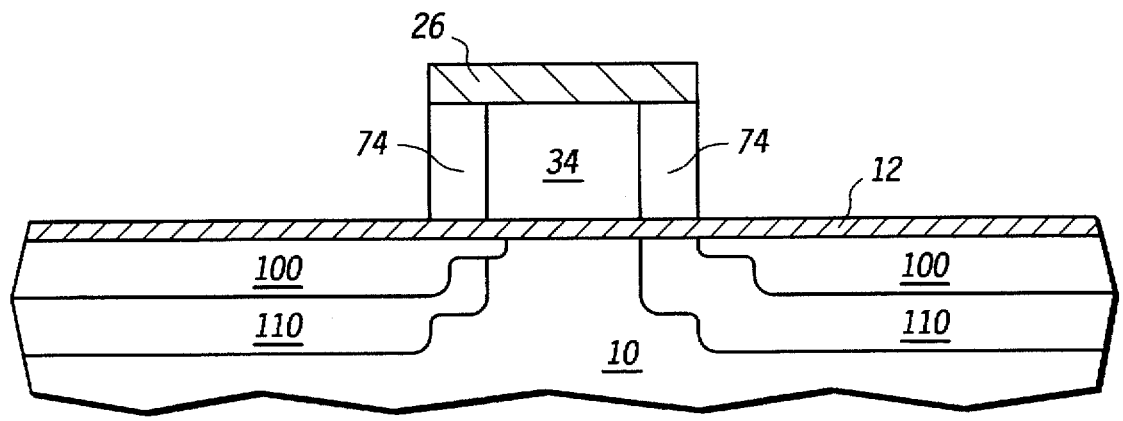

Processing is continued to form polysilicon portions 74 as shown in FIG. 12. The left polysilicon portion 74 overlies the left doped region 100, but the right polysilicon portion 74 does not overlie the right doped region 100. Additional processing steps are performed to form a substantially completed device that include source and drain regions, contact plugs, interconnects, and the like (not shown in FIG. 12). In the substantially completed device, the right doped region 100, lies completely within the drain region (not shown in FIG. 12).

Figure 13:
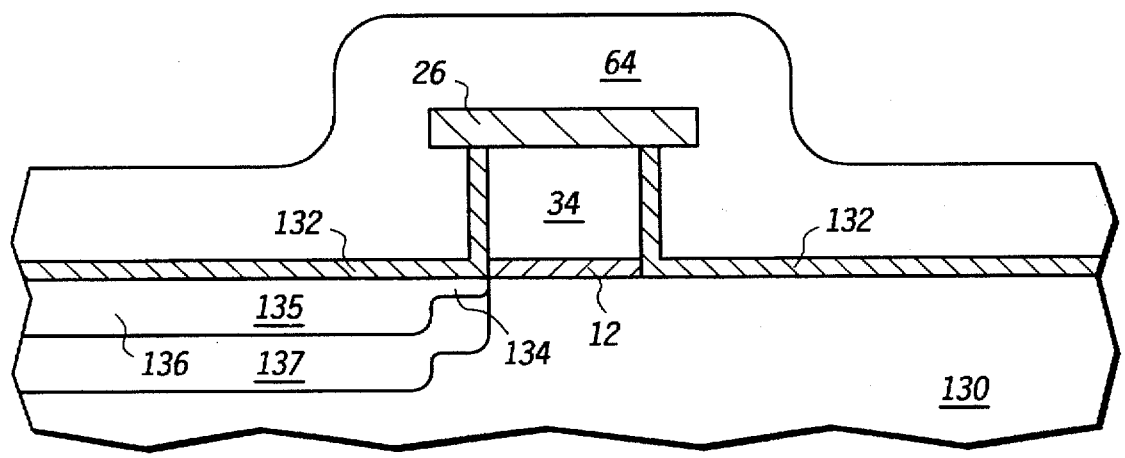
FIGS. 13 and 14 include cross-sectional views of still another embodiment of the present invention.

In other embodiments, conductivity types can be reversed to form a p-channel transistor. Also, more than one gate dielectric layer can be used. The steps used to form the structure as shown in FIG. 13 are performed and are similar to those used to form the structure shown in FIG. 3. Unlike FIG. 3, the p-type substrate 10 is replaced by an n-well region 130 as seen in FIG. 13. The resist member 18 and portions of the gate dielectric layer 12 not covered by the polysilicon member 34 are removed. A second gate dielectric layer 132 is formed over the n-well region 130 and along sides of the polysilicon member 34. The thickness and composition of the second gate dielectric layer 132 are typically similar to those used for the first gate dielectric layer 12. However, the first and second gate dielectric layers 12 and 132 can have different compositions or thicknesses.

Two ion implant steps are performed to form doped regions 135 and 137 that are similar in function to doped regions 40 and 50, respectively, in a previous embodiment. Doped region 135 is formed using singly charged phosphorous ions each having a mass of about 31 atomic mass units ($P+_{31}$). The implant is performed at an energy in range of 30–100 KeV. The doping concentration is about the same as that used to form doped region 40. Doped region 135 includes a body section 136 and a tip section 134. Doped region 135 including sections 134 and 136 is similar to doped region 40 that includes body section 46 and tip section 44 as seen in FIG. 4.

Figure 14:
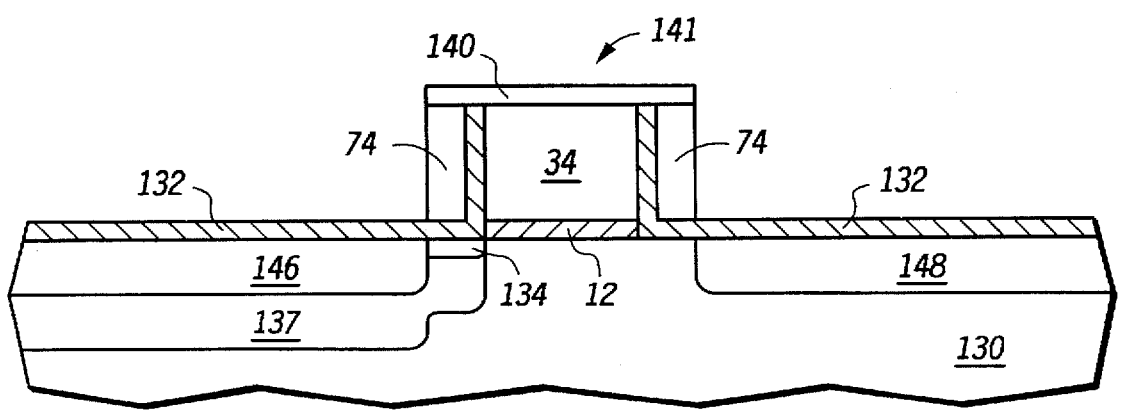

After forming doped region 137, the polysilicon layer 64 is deposited and etched to form the polysilicon portions 74 as seen in FIG. 14. The substrate is then ion implanted with a p-type dopant including boron or the like to form doped region 146 that is a source region and doped region 148 that is a drain region. After forming the doped regions 146 and 148, the silicon nitride member 26 is removed, and a refractory metal silicide member 140 is formed over the member 34 and portions 74. The combination of the members 34 and 140 and portions 74 forms a gate electrode 141. After forming the gate electrode 141, processing is continued to form a substantially completed device as previously described. In this particular embodiment, a p-channel transistor has been formed.

In previous embodiments, boron or phosphorus have been used to form the regions 40, 100, and 135. In these embodiments, the doping is performed with a doping species having a mass no greater than 34 atomic mass units. However, this should not be taken to eliminate arsenic or other relatively heavier ions that have a mass no less than 74 atomic mass units. The implanting energy increases as the mass of the doping species increases.

In another embodiment, resist member 48 is not required when forming doped region 40. However, another doped region similar to doped region 40 may cause problems such as a low diffusion junction breakdown between the other region and the drain region 78. Also, the transistor could be more susceptible to hot electron degradation due to a high field formed within the other doped region adjacent to the drain regions 78. Alternatively, resist member 48 can be removed after forming doped region 40 and before forming doped region 50. For this process, doped regions 50 would be formed near both sides of the polysilicon member 34 while doped region 40 would be formed near one side of the polysilicon member 34.

In yet another embodiment, a threshold voltage adjusting doping step can be used. This doping step is typically performed as an implanting step over all the channel region. The dose is usually no higher than about 1E11 ions per square centimeter because regions 40, 100, or 135 are present.

Benefits

A transistor having a nonuniformly doped channel region is fabricated that has a gate electrode width that is no larger than minimum resolution limit of the lithographic process used without having to use a complex process sequence. The width of the gate electrode 81 is about as wide as the silicon nitride member 26 that is a hard mask when forming the polysilicon portions 74. The gate electrode 81 is formed with only one lithographic step. When the silicon nitride member 26 is formed at the minimum resolution limit of the lithographic process used, the gate electrode 81 has a width close to the lithographic limit. If the minimum resolution limit is 0.35 microns, the gate electrode 81 can be formed such that it has a width of about 0.35 microns. Substrate area is efficiently used and results in higher yields.

The steps used to form the device described above does not require a complex processing sequence. New or marginal steps are not required. The processes require a couple of additional steps, but none of the additional steps require patterning a resist layer. Compared to complex devices, the embodiments of the present invention require fewer steps and should have better yields because of fewer steps.

The embodiments of the present invention make a transistor that has higher drain current compared to a similar transistor having a uniformly doped channel region at the gate dielectric layer. The drain current for the preceding embodiments should be in a range of 15-50 percent higher compared to the similar transistor with a uniformly doped channel region. In one embodiment, the drain current is 25-30 percent higher. Higher drain current typically produces a faster transistor.

In some of the embodiments, the tip sections are adjacent to the source region and not the drain region. The doping concentration within the channel region adjacent to the drain region is about the same as the substrate. The lower doping near the drain region means that the transistor is formed with less junction capacitance at the drain region-substrate interface. The transistor is typically faster because the time need to charge the junction capacitor is less.

The doped regions 40, 100, and 135 are formed without a dopant drive step. The drive step diffuses not only the dopant used within the channel region, but also drives all other dopants already present within the substrate. Electrical characteristics of the device can be changed by the drive step.

In the foregoing specification, the invention has been described with reference to specific embodiments thereof. However, it is evident that various modifications and changes can be made thereto without departing from the scope of the invention as set forth in the appended claims. Accordingly, the specification and figures are to be regarded in an illustrative rather than a restrictive sense.

We claim:

1. A process for forming a semiconductor device comprising the steps of:
   forming a gate dielectric layer over a substrate, wherein the substrate has a first conductivity type;
   forming a first layer over the gate dielectric layer;
   forming a masking member over the first layer;
   etching the first layer to form a first member that is narrower than the masking member such that an extension portion of the masking member does not overlie the first member, wherein a portion of the gate dielectric layer is exposed during this step;
   selectively doping the substrate with a dopant having the first conductivity type such that a first portion of the substrate is doped and underlies the extension portion but a second portion of the substrate underlies the first member and is not doped during this step, wherein the second portion is different from the first portion, and wherein this step is performed using implantation that is not at a tilt angle;
   forming a second layer over the substrate and adjacent the first member and the masking member;
   etching the second layer to remove a portion of the second layer, wherein:
   a gate electrode includes the first member and a remaining portion of the second layer; and
   the gate electrode is at least as wide at the masking member; and
   doping a third portion of the substrate not covered by the first member and the remaining portion of the second layer, wherein:
   this step is performed using a dopant having a second conductivity type that is opposite the first conductivity type; and
   the third portion is adjacent to the first portion.

2. The process of claim 1, further comprising a step of removing the masking member before forming the step of forming the second layer.

3. The process of claim 2, further comprising a step of forming a conductive member over the first member and the remaining portion of the second layer after the step of removing the masking member, wherein the conductive member is electrically connected to the first member and the remaining portion of the second layer.

4. The process of claim 3, further comprising a step of forming a second dielectric layer along a side of the first member before the step of forming the second layer, wherein the step of forming the second layer is performed such that the second dielectric layer and the masking member lie between the first member and the second layer.

5. The process of claim 1, wherein:
the step of etching the first layer comprises steps of:
anisotropically etching the first layer to remove a portion of the first layer that is not covered by the masking member; and
isotropically etching the first layer after the step of anisotropically etching; and
the step of etching the second layer includes an anisotropic etching step.

6. The process of claim 1, wherein the step of selectively doping is performed using a doping species having a mass no greater than 34 atomic mass units.

7. The process of claim 1, wherein the step of selectively doping is performed using a doping species having a mass no less than 74 atomic mass units.

8. The process of claim 1, wherein the third portion of the substrate is a source region.

9. The process of claim 1, wherein the first layer and the second layer include silicon and the masking member includes a material selected from a group consisting of an oxide and a nitride.

10. The process of claim 1, wherein the step of selectively doping dopes a fourth portion of the substrate that lies adjacent to the second portion and an opposite side of the first member compared to the first portion.

11. The process of claim 10, wherein:
the process further comprises a step of selectively doping the substrate such that a fifth portion and a sixth portion of substrate are doped, wherein:
the fifth portion lies adjacent to the first and second portions;
the sixth portion lies adjacent to the second and fourth portions;
each of the fifth and sixth portions extends further from a primary surface of the substrate compared to the first and fourth portions; and
this step is performed before forming the second layer; and
the step of doping the third portion also dopes a seventh portion of the substrate not covered by the first member and the second layer,
wherein:
the third and seventh portions lie adjacent to opposites sides of the gate electrode;
the first portion extends beyond the third portion towards the seventh portion in a direction substantially parallel to the primary surface;
the fourth portion extends beyond the seventh portion towards the third portion in a direction substantially parallel to the primary surface; and
the first and fourth portions are spaced apart from each other.

12. A process for forming a semiconductor device comprising the steps of:
forming a gate dielectric layer over a substrate, wherein the substrate has a first conductivity type;
forming a first layer over the gate dielectric layer;
forming a masking member over the first layer;
etching the first layer to form a first member that is narrower than the masking member, wherein a portion of the gate dielectric layer is exposed during this step;
selectively doping the substrate with a dopant having the first conductivity type such that a first portion of the substrate underlying the masking member is doped but a second portion of the substrate underlying the first member is not doped during this step, wherein the second portion is different from the first portion, and wherein this step is performed using implantation that is not at a tilt angle;
selectively forming a second layer over the substrate and adjacent the first member, wherein:
a gate electrode includes the first member and the second layer; and
the gate electrode is at least as wide at the masking member; and
doping a third portion of the substrate not covered by the first member and the second layer, wherein:
this step is performed using a dopant having a second conductivity type that is opposite the first conductivity type; and
the third portion is adjacent to the first portion.

13. The process of claim 12, wherein the masking member includes a material selected from a group consisting of an oxide and a nitride.

14. The process of claim 12, wherein the step of etching the first layer comprises steps of:
anisotropically etching the first layer to remove a portion of the first layer that is not covered by the masking member; and
isotropically etching the first layer after the step of anisotropically etching.

15. The process of claim 12, wherein the third portion of the substrate is a source region.

16. The process of claim 12, wherein the step of selectively doping is performed using a doping species having a mass no greater than 34 atomic mass units.

17. The process of claim 12, wherein the step of selectively doping is performed using a doping species having a mass no less than 74 atomic mass units.

18. The process of claim 12, wherein the step of selectively doping dopes a fourth portion of the substrate that lies adjacent to the second portion and an opposite side of the first member compared to the first portion.

19. The process of claim 18, wherein:
the process further comprises a step of selectively doping the substrate such that a fifth portion and a sixth portion of substrate are doped, wherein:
the fifth portion lies adjacent to the first and second portions;
the sixth portion lies adjacent to the second and fourth portions; and
each of the fifth and sixth portions extends further from a primary surface of the substrate compared to the first and fourth portions; and
the step of doping the third portion also dopes a seventh portion of the substrate not covered by the first member and the second layer,
wherein:
the third and seventh portions lies adjacent to opposite sides of the gate electrode;
the first portion extends beyond the third portion towards the seventh portion in a direction substantially parallel to the primary surface;
the fourth portion extends beyond the seventh portion towards the third portion in a direction substantially parallel to the primary surface; and
the first and fourth portions are spaced apart from each other.

20. A process for forming a semiconductor device comprising the steps of:
forming a gate dielectric layer over a substrate, wherein the substrate has a first conductivity type;

forming a first layer over the gate dielectric layer, wherein the first layer includes a material selected from a group consisting of silicon and a metal-containing material;

forming an insulating layer over the first layer;

anisotropically etching the first layer and the insulating layer;

isotropically etching the first layer such that it is narrower than the insulating layer, wherein a portion of the gate dielectric layer is exposed during this step;

selectively doping the substrate with a dopant having the first conductivity type such that a first portion of the substrate is doped and underlies the insulating layer, a second portion of the substrate underlying the first layer is not doped during this step, wherein the second portion is different from the first portion, and wherein this step is performed using implantation that is not at a tilt angle;

forming a second layer over the substrate and adjacent the first layer and the insulating layer, wherein the second layer includes a material selected from a group consisting of silicon and a metal-containing material;

etching the second layer to remove portions of the second layer, wherein:

a gate electrode includes the first layer and the second layer; and the gate electrode is at least as wide at the insulating layer after the step of anisotropically etching; and doping portions of the substrate not covered by the first layer and the second layer to form a source region and a drain region, wherein:

this step is performed using a dopant having a second conductivity type that is opposite the first conductivity type;

the source and drain regions lie adjacent to opposite sides of the gate electrode;

a channel region lies between the source and drain regions; and the first portion lies adjacent to the source region and extends into the channel region.

21. The process of claim 20, further comprising a step of removing the insulating layer after the step of etching the second layer.

22. The process of claim 21, further comprising a step of forming a conductive member over the first layer and the second layer after the step of removing the insulating layer, wherein the conductive member is electrically connected to the first layer and the second layer.

23. The process of claim 22, further comprising a step of forming another dielectric layer, wherein:

the another dielectric layer is formed along a side of the first layer before forming the second layer; and the step of forming the second layer is performed such that the another dielectric layer and the insulating layer lie between the first layer and the second layer.

24. The process of claim 20, wherein the step of selectively doping is performed using a doping species having a mass no greater than 34 atomic mass units.

25. The process of claim 20, wherein the step of selectively doping is performed using a doping species having a mass no less than 74 atomic mass units.

26. The process of claim 20, wherein:

the step of selectively doping dopes a third portion of the substrate that lies adjacent to the second portion and an opposite side of the first layer compared to the first portion; and the step of doping portions of the substrate is performed such that the third portion lies adjacent to the drain region and extends into the channel region.

27. The process of claim 20, further comprising a step of selectively doping a third portion of substrate, wherein:

the third portion lies adjacent to first and second portions;

the third portion extends further from a primary surface of the substrate compared to the first portion; and this step is performed before forming the second layer.

* * * * *